United States Patent
Zoestbergen et al.

(10) Patent No.: US 11,220,739 B2
(45) Date of Patent: Jan. 11, 2022

(54) APPARATUS FOR FEEDING A LIQUID MATERIAL TO AN EVAPORATOR DEVICE

(71) Applicant: TATA STEEL NEDERLAND TECHNOLOGY B.V., Velsen-Noord (NL)

(72) Inventors: Edzo Zoestbergen, Alkmaar (NL); Colin Commandeur, Beverwijk (NL); Roland Jan Snijders, Wijk aan Zee (NL); Eduard Paul Mattheus Bakker, Sint Pancras (NL); Peter William Hazelett, Winooski, VT (US); Douglas Alexander Hamilton, Shelburne, VT (US); Stephen James Widdis, Colchester, VT (US); Timothy Dean Kaiser, Colchester, VT (US)

(73) Assignee: TATA STEEL NEDERLAND TECHNOLOGY B.V., Velsen-Noord (NL)

( * ) Notice: Subject to any disclaimer, the term of this patent is extended or adjusted under 35 U.S.C. 154(b) by 105 days.

(21) Appl. No.: 16/098,523

(22) PCT Filed: May 1, 2017

(86) PCT No.: PCT/EP2017/060316
§ 371 (c)(1),
(2) Date: Nov. 2, 2018

(87) PCT Pub. No.: WO2017/191082
PCT Pub. Date: Nov. 9, 2017

(65) Prior Publication Data
US 2019/0153587 A1    May 23, 2019

(30) Foreign Application Priority Data

May 3, 2016 (EP) .................................. 16168167

(51) Int. Cl.
*C23C 14/24* (2006.01)
*H02K 44/04* (2006.01)

(52) U.S. Cl.
CPC ........... *C23C 14/246* (2013.01); *H02K 44/04* (2013.01)

(58) Field of Classification Search
CPC ....... C23C 14/246; C23C 14/24; C23C 14/26; C23C 14/243; H02K 44/04
(Continued)

(56) References Cited

U.S. PATENT DOCUMENTS

| 847,395 A | 3/1907 | Boehm |
| 2,664,852 A | 1/1954 | Chadsey |

(Continued)

FOREIGN PATENT DOCUMENTS

| CN | 1969056 A | 5/2007 |
| CN | 104395495 A | 3/2015 |

(Continued)

OTHER PUBLICATIONS

International Search Report and Written Opinion dated Jun. 9, 2017 for PCT/EP2017/060316 to Tata Steel Nederland B.V. filed May 1, 2017.

*Primary Examiner* — Aiden Lee
(74) *Attorney, Agent, or Firm* — Vorys, Sater, Seymour and Pease LLP

(57) ABSTRACT

An apparatus for feeding liquid metal to an evaporator device in a vacuum chamber, wherein the apparatus includes a container adapted to contain a liquid metal, a feed tube from the closed container to the evaporator device and an electromagnetic pump provided in the feed tube, and wherein the electromagnetic pump is placed in a vacuum enclosure.

22 Claims, 4 Drawing Sheets

(58) Field of Classification Search
USPC .......................................................... 118/726
See application file for complete search history.

(56) References Cited

U.S. PATENT DOCUMENTS

| | | | |
|---|---|---|---|
| 3,059,612 A | | 10/1962 | Baughman et al. |
| 3,408,224 A | | 10/1968 | Ashburn et al. |
| 3,581,766 A | | 6/1971 | Gimigliano et al. |
| 4,389,169 A | * | 6/1983 | De Dionigi ............ H02K 33/02 310/30 |
| 4,392,786 A | | 7/1983 | Merenkov et al. |
| 4,606,296 A | * | 8/1986 | Gailliard ............... C30B 23/066 118/724 |
| 5,536,324 A | * | 7/1996 | Fuchita ................. C23C 14/025 118/308 |
| 6,362,098 B1 | * | 3/2002 | Breeden ................ C23C 16/045 257/E21.279 |
| 2003/0203638 A1 | * | 10/2003 | Van Slyke ............ C23C 14/246 438/709 |
| 2005/0072361 A1 | | 4/2005 | Yang et al. |
| 2007/0218201 A1 | * | 9/2007 | Gottsman ............. C23C 14/246 427/248.1 |
| 2010/0124022 A1 | * | 5/2010 | Causevic ................ G06F 1/203 361/702 |
| 2014/0127406 A1 | * | 5/2014 | Banaszak ............. C23C 14/246 427/250 |
| 2019/0264320 A1 | | 8/2019 | Zoestbergen et al. |

FOREIGN PATENT DOCUMENTS

| | | |
|---|---|---|
| CN | 204805055 U | 11/2015 |
| EP | 2831305 | 2/2015 |
| GB | 1220020 A | 1/1971 |
| JP | S59038379 A | 3/1984 |
| KR | 20070011542 A | 1/2007 |
| KR | 20140145168 A | 12/2014 |
| WO | 2012081738 A1 | 6/2012 |
| WO | 2013143692 A | 10/2013 |
| WO | 2013143692 A1 | 10/2013 |
| WO | 2015067662 A1 | 5/2015 |
| WO | 2017191081 A | 11/2017 |
| WO | 2017191083 A | 11/2017 |

* cited by examiner

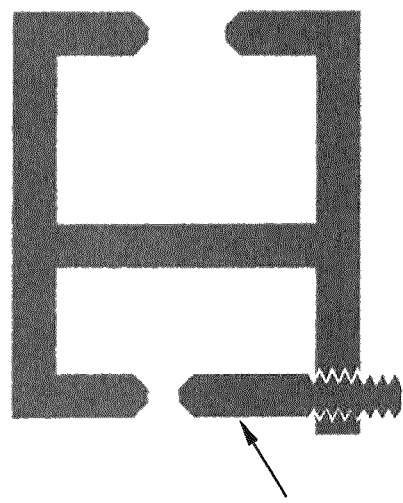 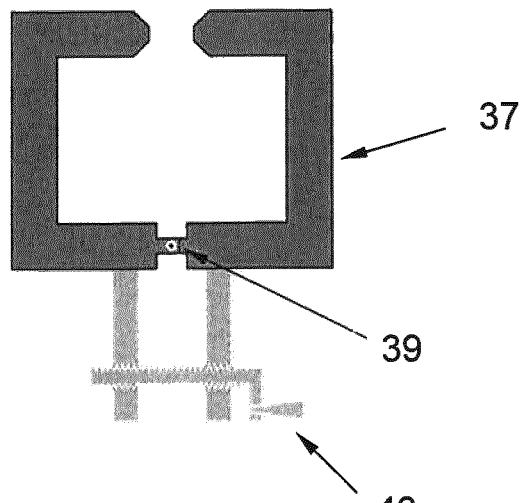
Fig. 3A    38    Fig. 3B    40

APPARATUS FOR FEEDING A LIQUID MATERIAL TO AN EVAPORATOR DEVICE

CROSS-REFERENCE TO RELATED APPLICATIONS

This is a § 371 National Stage Application of International Application No. PCT/EP2017/060316 filed on May 1, 2017, claiming the priority of European Patent Application No. 16168167.1 filed on May 3, 2016.

FIELD OF THE INVENTION

The invention relates to an apparatus for feeding liquid metal to an evaporator device in a vacuum chamber. Such a device is for instance used in deposition of a metal coating on a substrate by means of physical vapour deposition (PVD).

BACKGROUND OF THE INVENTION

For continuous or semi-continuous PVD coating processes on an industrial scale a vacuum coating set-up is required that is able to process large amounts of coating material over time. Furthermore, when thermal evaporation is used the temperature of the liquid in the evaporator device has to be much higher than the melting point of the material to be evaporated. Hence, it is desirable and cost effective to have a small evaporator device and to supply material into the evaporator device to meet the demand. Feeding can be done with either solid or liquid material. However, the best way is to feed with liquid metal from a large liquid reservoir which has the advantage that the oxide content in the evaporator is minimised and that the latent heat of melting and the specific heat of the material do not have to be supplied at the evaporator device.

The PVD coating device disclosed in U.S. Pat. No. 2,664,852 has a reservoir for liquid metal in the vacuum chamber. With this set-up the maximum campaign length is quite limited. In more recent PVD coating devices the liquid metal reservoir is places outside the vacuum chamber, see for instance WO2012081738. However, due to the pressure difference between the vacuum at the evaporator device and the liquid metal reservoir a force is executed on the liquid metal in the reservoir which needs to be controlled. This force will change when the liquid level in the reservoir drops, the vacuum pressure at the evaporator device changes or the level in the evaporator device changes and needs to be controlled to keep a constant supply to the evaporator device to ensure a constant evaporation.

The supply of liquid metal from the liquid metal container to the evaporator device can be controlled in different ways. In U.S. Pat. No. 3,059,612 it is disclosed to lift the container with liquid metal in order to keep the height difference between the liquid metal surface in the evaporator device and the level in the liquid metal container constant. However, a change in barometric pressure will already give rise to a different level in the evaporator device and as a result a change in evaporation.

In U.S. Pat. No. 3,581,766 an additional reservoir is provided between the main liquid metal container and the evaporator device. In this intermediate reservoir the level is kept constant by means of an overflow drain through which the liquid flows out of the intermediate reservoir back to the main liquid metal container. However, the issue with a varying barometric pressure still exist and the question how to start or stop the system without breaking the vacuum might prove difficult. Hence, first off-all a valve is required between the liquid metal container and the evaporator device, see for example WO012081738. It is tried to use such a valve to control the flow but this is impractical and it is not possible to empty the evaporator device at the end of an experiment without breaking the vacuum. A better solution is disclosed in WO013143692 where both a valve and a pump are used to control the flow.

However, there are still other issues that are not covered in the aforementioned publications. One of the issues with the reservoir being located outside the vacuum chamber is related to the fact that the feed tube has to pass through the wall of the vacuum chamber. The feed through for the feed tube must be able to accommodate the expansion difference that occur during heating of the whole set-up but should be such that the vacuum conditions in the chamber are not affected. This can be done with a bellow type of connection, see for instance GB1220020, but it is just as important that this set-up does not generate a cold spot which might result in freezing of the melt and as such a blockage.

Another requirement is that all the tubing and the electromagnetic pump should be heated to the required temperature and maintained at that temperature during operation. More in particular the heating of the electromagnetic pump requires special attention because due to the construction of the electromagnetic pump cold spots in the pump may easily occur.

Another issue with the reservoir being located on the outside is possible contamination of the feeding system with oxides from the liquid container which might be introduced in the evaporator or the tubing and generate issues with the evaporation or blockage. In patent JPS5938379 a start up procedure is described that uses a reducing gas to remove the oxides. However this will not work for all kinds of liquids and the vacuum is changed during this process.

Jet another requirement is that all the tubing should be heated to the required temperature and furthermore as stated in U.S. Pat. No. 3,408,224 it might be necessary to degas the liquid material prior to the deposition to assure that this degassing is not occurring in the evaporator which might disturb the evaporation process.

Finally the method disclosed in WO015067662 makes it possible to drain the evaporator without braking the vacuum but it is without additional measures not possible to empty all the tubing in the system.

OBJECTIVES OF THE INVENTION

It is an objective of the present invention to provide an apparatus for feeding a liquid metal to an evaporator device with a sufficient heating of the electromagnetic pump.

It is another objective of the present invention to provide an apparatus for feeding a liquid metal to an evaporator device with a sufficient heating of the tubes of the system.

It is another objective of the present invention to provide an apparatus for feeding a liquid metal to an evaporator device wherein heat losses of the electromagnetic pump and the tubes of the system is further limited.

It is another objective of the present invention to provide an apparatus for feeding a liquid metal to an evaporator device wherein pressure losses in the vacuum chamber because of the feed through of the feed tube are prevented as much as possible.

It is another objective of the present invention to provide an apparatus for feeding a liquid metal to an evaporator device wherein pressure losses in the liquid metal container because of the feed through of the feed tube are prevented as much as possible.

It is still another objective of the present invention to provide an apparatus for feeding a liquid metal to an evaporator device which enable the emptying of the feed tube and electromagnetic pump without losing the vacuum in the vacuum chamber.

DESCRIPTION OF THE INVENTION

According to a first aspect of the invention one or more of the objectives of the invention are realized by providing an apparatus for feeding liquid metal to an evaporator device in a vacuum chamber, the apparatus further comprising a container adapted to contain a liquid metal, a feed tube from the container to the evaporator device and an electromagnetic pump provided in the feed tube, wherein a vacuum enclosure is provided which encloses the electromagnetic pump.

With such a vacuum enclosure the heat losses of the electromagnetic pump are reduced because the heat loss as a result of heat convection is reduced to a large extent.

According to a further aspect of the invention it is provided that the vacuum enclosure encloses at least part of the feed tube. The at least part of the feed tube concerns part or complete feed tube as far as it is outside the closed container adapted to contain a liquid metal and the vacuum chamber.

It is preferably provided that the vacuum enclosure connects to the vacuum chamber and/or the closed container. With this set-up the whole part of the feed tube outside the closed container and the vacuum chamber is within the vacuum enclosure.

According to a further aspect of the invention it is provided that the vacuum enclosure is connected to the vacuum chamber and/or the container by means of a flexible connecting member. With this feature the expansion of each or all of closed container, vacuum enclosure and vacuum chamber will be accommodated.

With the electromagnetic pump and the feed tube in the vacuum enclosure the heat loss through convection is limited where it counts the most, in between the closed container and the vacuum chamber. In this manner cold spots in the electromagnetic pump and feed tube are prevented therewith preventing restriction of the flow of liquid metal and clogging.

The pressure in the vacuum enclosure is kept in the range of 1 mbar to atmospheric pressure, which is roughly 1000 mbar. With the start and at the end of an operation cycle or campaign of the apparatus, that is with the filling and emptying of the feed tube and the electromagnetic pump respectively the pressure in the vacuum enclosure is about atmospheric pressure. During operation the pressure in the vacuum enclosure is preferably kept in the range of 1-200 mbar. By keeping the pressure in the vacuum enclosure in the low vacuum range the gas leakage into the vacuum chamber is much less than without the vacuum enclosure. Such a pressure loss in the vacuum chamber occurs at the feed through of the feed tube into the vacuum chamber and is influenced by the expansion differences of the different components of the whole set-up.

According to a further aspect of the invention the electromagnetic pump is at least partially made of an electric conductive material. With this feature it is possible to apply resistance heating to the electromagnetic pump. The electric conductive material should also be suitable to be used to pump liquid metal. This would be different if the electromagnetic pump is made out of more than one material, which however is not very practical and would raise more problems than it would have advantages.

A suitable embodiment is wherein the electromagnetic pump is at least partially made of graphite. Graphite is an electric conductive material and is able to withstand high temperatures and the chemical attack of liquid metals, such as Zn and Mg.

According to a preferred embodiment of the invention the electrodes of the electromagnetic pump are provided against the pump. With the electrodes against the outside of the pump body or in a recess in the pump body the current needed for the control of the electromagnetic pump is conducted for a part through the body of the electromagnetic pump and for a part through the liquid metal to be controlled with the electromagnetic pump.

The electromagnetic pump controls the flow of the liquid metal by the Lorentz force exerted on the liquid metal which is dependent on the applied magnetic field and the current through the liquid metal. For the heating of the electromagnetic pump it will be necessary to be able to control the current independently from the control of the flow of the liquid metal. This could be done by controlling the applied magnetic field or controlling the force exerted on the liquid metal in the container or by controlling both. Control of the magnetic field is done by controlling the distance of the magnetic poles to the electromagnetic pump body or in case of a direct or alternating current electromagnet by controlling the current through the coil of the electromagnet.

According to a further aspect of the invention control means are provided to control a force on the liquid metal in the container adapted to contain a liquid metal. According to a further aspect it is provided that the container adapted to contain a liquid metal is a closed container and wherein the control means control the pressure of a gas in the closed container. The term "closed container" will mean a container wherein the pressure and/or the composition of the gas inside the container is or can be controlled.

By varying the pressure on the liquid metal in the closed container the flow rate of the liquid metal to the evaporator device is varied. By varying the current through the electromagnetic pump the force exerted on the liquid metal is varied and therewith the flow rate. If the temperature of the electromagnetic pump has to be adjusted, the current through the electromagnetic pump has to be adjusted and in order to control the flow rate at the same time the pressure on the liquid metal in the closed container might have to be adjusted.

According to a specific embodiment the pressure on the liquid metal in the closed container is controlled such that the force exerted on the liquid metal by the electromagnetic pump is a force against the flow direction of the liquid metal to the evaporator device. In this case the control of the flow rate by the electromagnetic pump is determined by a force against the flow direction to the evaporator device. The advantage of this configuration is that the temperature is automatically increased when the flow rate is reduced. At higher flow rates there is less change that cold spots will generate issues with freezing or blocking.

According to a further aspect of the invention control means are provided to control the magnetic field for the electromagnetic pump, By varying the magnetic field the force exerted by the electromagnetic pump on the liquid metal is varied.

According to a further aspect of the invention the control means control the distance of the magnet poles with respect of the electromagnetic pump and/or where the magnetic field is provided by means of a direct or alternating current electromagnet, control the current through the coil of the electromagnet.

It is further provided that the magnet to apply a magnetic field for the electromagnetic pump is provided outside the vacuum enclosure. The advantage is that the size of the vacuum enclosure can be smaller, that no feed-through is necessary in case of an electromagnet and that the magnet remains outside a space with an elevated temperature which is particularly relevant when using permanent magnets. Moreover, when the magnetic field is to be controlled by controlling the distance of the magnetic poles to the electromagnetic pump, the construction is less complicated with the magnet outside the vacuum enclosure.

By providing that the magnet to apply a magnetic field for the electromagnetic pump comprises a permanent magnet the construction will be easier.

According to a further aspect of the invention a valve is provided in the feed tube between the electromagnetic pump and the evaporator device. With the valve the feed tube can be closed after the feed tube has been drained, therewith preventing that the vacuum chamber could come into contact with low vacuum or atmospheric pressure in the closed container.

According to a further aspect of the invention a return tube and an electromagnetic pump in the return tube is provided, wherein the return tube runs from the evaporator device to the container adapted to contain a liquid metal. With a feed tube and a return tube the composition of the liquid metal in the evaporator device can be controlled. Control of the composition means that the composition remains constant as much as possible and is not changed because of different evaporation rates of constituents.

According to a further aspect of the invention the electromagnetic pump in the feed tube and the electromagnetic pump in the return tube are positioned adjacent to each other and the magnetic field for both electromagnetic pumps is supplied by the same magnet. According to an alternative embodiment the electromagnetic pump in the feed tube and the electromagnetic pump in the return tube are positioned adjacent to each other and wherein the current for both electromagnetic pumps is supplied by the same power supply.

BRIEF DESCRIPTION OF THE DRAWINGS

The invention will be further explained by the example shown in the drawing, in which:

FIG. 3A,3B shows schematically two configurations to control the distance of the magnetic poles to the electromagnetic pump.

DETAILED DESCRIPTION OF THE DRAWINGS

Figure 1:
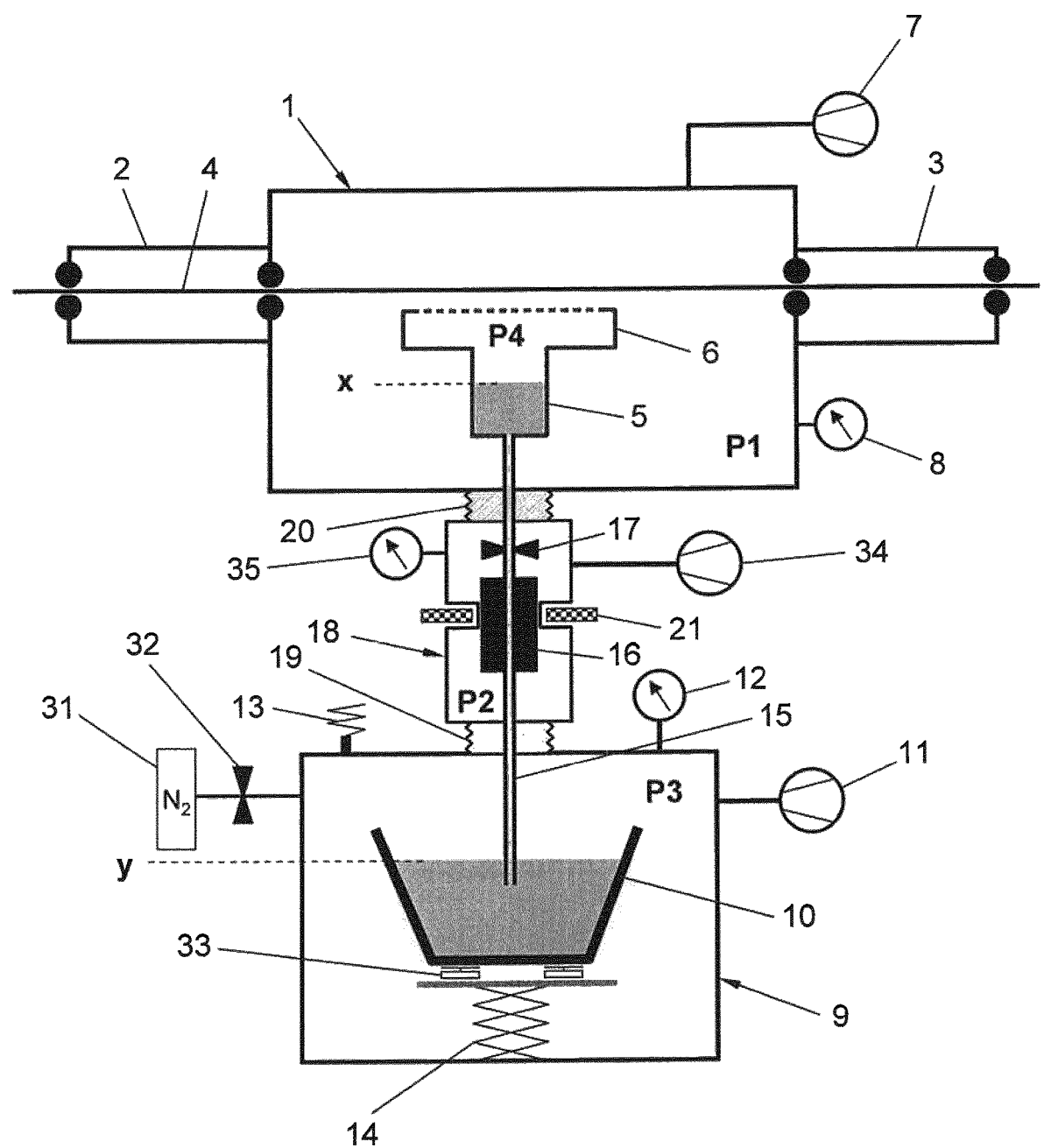
FIG. 1 shows a schematic view of an apparatus with a container for a liquid metal, an electromagnetic pump in a vacuum enclosure and a vacuum chamber.

FIG. 1 shows a schematic view of an apparatus with a vacuum chamber 1, on both sides provided with vacuum locks 2,3, through which a strip 4 is guided. An evaporator device 5 is positioned inside the vacuum chamber 1 and connected to a vapour distributor 6. The means to supply sufficient energy to the evaporator device, such as an induction coil, are also placed inside the vacuum chamber. For the sake of clarity these means are not shown in the drawing. The vacuum chamber is further provided with vacuum pump 7 and manometer 8.

At the bottom of FIG. 1 a closed container 9 is provided with inside the container a vessel 10 to hold a liquid metal. The closed container 9 is further provided with a pump 11, manometer 12 and overpressure relay 13. The vessel is provided with heating means (not shown) to heat and melt the metal and/or to keep the liquid metal at a certain temperature. A gas supply 31 with a valve 32 is connected to closed container 9 to replace the air initially present in container 9 with a non-oxidising gas, for instance N2. Lifting means 14 are provided to lift and lower vessel 10 to be able to immerse the end of feed tube 15 into the liquid metal or lift it out of the liquid metal. The lifting means 14 can also be used in the control of the flow rate of the liquid metal to the evaporator device 5, since with the lifting and lowering the distance between the liquid level in the vessel and that in the evaporation device changes.

The vessel 10 is placed on weighing devices 33 which allows to continuously weigh the content of vessel 10 which provides additional information on the flow rate of the liquid metal and the evaporation rate.

The pump 11 is used to lower the pressure in the closed container. In order to prevent oxidation of the liquid metal in the vessel the air in the closed container can be removed and replaced completely or partially with an inert gas. With this operation the air is first partially removed therewith lowering the pressure before being replaced by an inert gas after which the pressure in the closed container is adjusted and controlled in order to control the flow rate of the liquid metal to the evaporator device.

The feed tube 15 runs from the vessel 10 inside the closed container 9 in upward direction to the evaporator device 5 and in the feed tube an electromagnetic pump 16 and a valve 17 are provided. The electromagnetic pump 16 and valve 17 are placed inside a vacuum enclosure 18. The vacuum enclosure 18 is kept at a low vacuum during operation which prevent heat losses through convection from the electromagnetic pump 16 as well as from the feed tube 15 to a great degree. To that end the vacuum enclosure 18 is provided with a vacuum pump 34 and a manometer 35 or a collocation of these.

The vacuum enclosure 18 connects to the closed container 9 and the vacuum chamber 1 by means of bellows 19, 20. The connection by means of the bellows 19, 20 is to the outside of the closed container 9 and the vacuum chamber 1 and does not connect the internal spaces of container 9 and vacuum chamber 1. However, the unavoidable vacuum leak at the feed through of the feed tube 15 into the vacuum chamber 1 is much less because of the low vacuum in the vacuum enclosure 18.

The electromagnetic pump 16 pump is provided with a permanent magnet 21 to generate a magnetic field and a power supply to pass a current through the liquid metal in the electromagnetic pump. The Lorentz force resulting from the magnetic field and the current will exert a force on the liquid metal which is used in the control of the flow rate of the liquid metal. The Lorentz force only works as long as the liquid metal is in contact with the electrodes 22 of the electromagnetic pump and within the magnetic field of permanent magnet 21. As a result when the liquid metal is forced downwards the liquid metal level can not be lower than a level at about the height of the electrodes.

It is important that the magnet 21 is not overheated because this will result in a decrease of the strength of the magnetic field. For that reason the magnet 21 is placed outside the vacuum enclosure 18, which at least at the location of the magnet and its magnetic field is made of a non-ferromagnetic material.

The upward force on the liquid metal is given by the pressure difference and the column height:

$$P3-P1-(X-Y)*\text{density liquid, wherein}$$

P3=the pressure in the closed container,
P1=the pressure in the vacuum chamber,
X=height top level of the liquid metal, which can be in the evaporator device or somewhere in the feed tube, and
Y=height level of the liquid metal in the vessel in the closed container.

Once the evaporation of the liquid metal in the evaporator device has started the driving force for the liquid metal is:

$$P3-P4-(X-Y)*\text{density liquid, wherein}$$

P4 is the pressure in the vapour distributor 6 which will be higher than the pressure in the vacuum chamber.
When the electromagnetic pump is exerting a force against the upward flow of the liquid metal the force is given by:

$$P3-P1-(X-Y)*\text{density liquid}-B*I*C, \text{wherein:}$$

B is magnetic field, I the current through the liquid metal and C a constant. Once the evaporation has started the equation changes to:

$$P3-P4-(X-Y)*\text{density liquid}-B*I*C$$

If the heating of the electromagnetic pump has to be increased, P3 is increased which will require a larger Lorentz force against the upward flow in order to keep the upward flow constant. The larger Lorentz force is realized to increase the current through the electromagnetic pump and the liquid metal, which will provide the extra resistance heating.

Figures 2A, 2B:
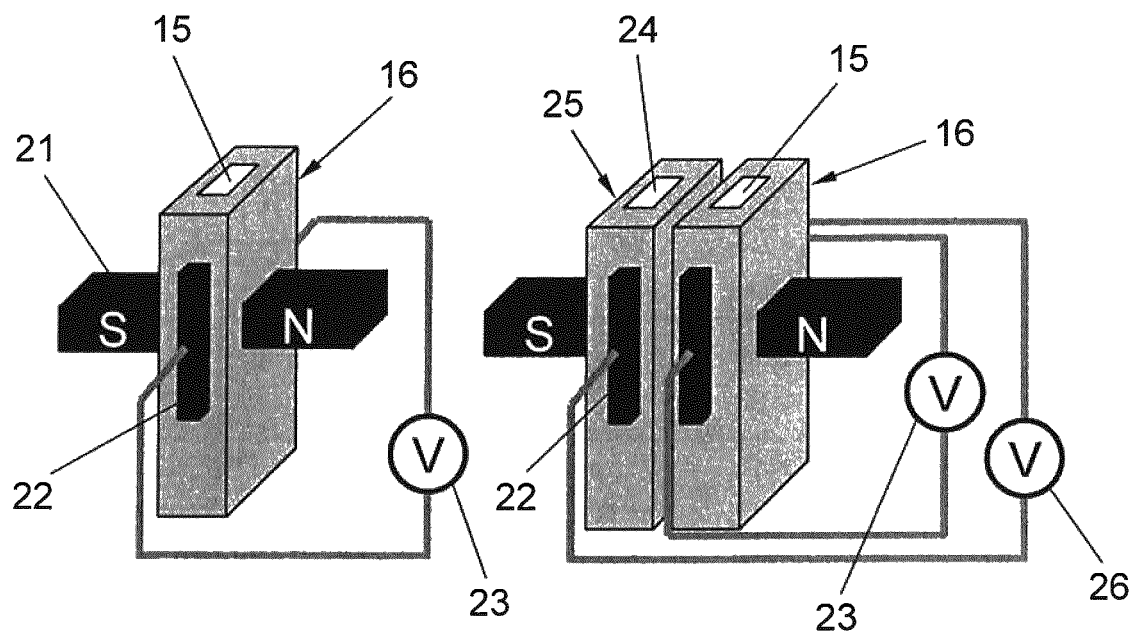
FIG. 2A,2B,2C shows a schematic view of respectively an electromagnetic pump for a feed tube and an electromagnetic pump for a feed tube and return tube.

FIG. 2A shows a schematic view of an electromagnetic pump 16 for a feed tube 15 with the electrodes 22 on opposite sides against the body of the electromagnetic pump 16. The electrodes 22 are connected to a power supply 23, in this case a variable DC power supply.

Perpendicular to the electrodes 22 are the poles of magnet 21, which in this configuration are two permanent magnets connected by means of a yoke (not shown). Instead of permanent magnets it is also possible to use an electromagnet, for instance an electromagnet with a DC coil. By varying the current through the coil the magnetic field could be varied.

Instead of a variable DC power supply and a DC coil it is as well possible to use a variable AC power supply and an AC coil for the electromagnet.

FIG. 2B shows a configuration with a feed tube 15 and a return tube 24 next to each other with electromagnetic pumps 18, 25 for respectively the feed tube 15 and return tube 24. The magnetic field for both the feed tube 15 and the return tube 24 is provided with the same permanent magnets 21. Separate variable DC power supplies 23, 26 are provided for respectively the feed tube 15 and the return tube 24 which are reversely connected to the electrodes since the Lorentz forces should be in opposite direction. The feed tube 15 and the return tube 24 are in thermal contact with each other but electrically isolated from each other. The flow rate in the return tube will differ by the evaporation rate from the flow rate in the feed tube and for that reason the current through the return tube 24 will be larger than through the feed tube 15.

Figure 2C:
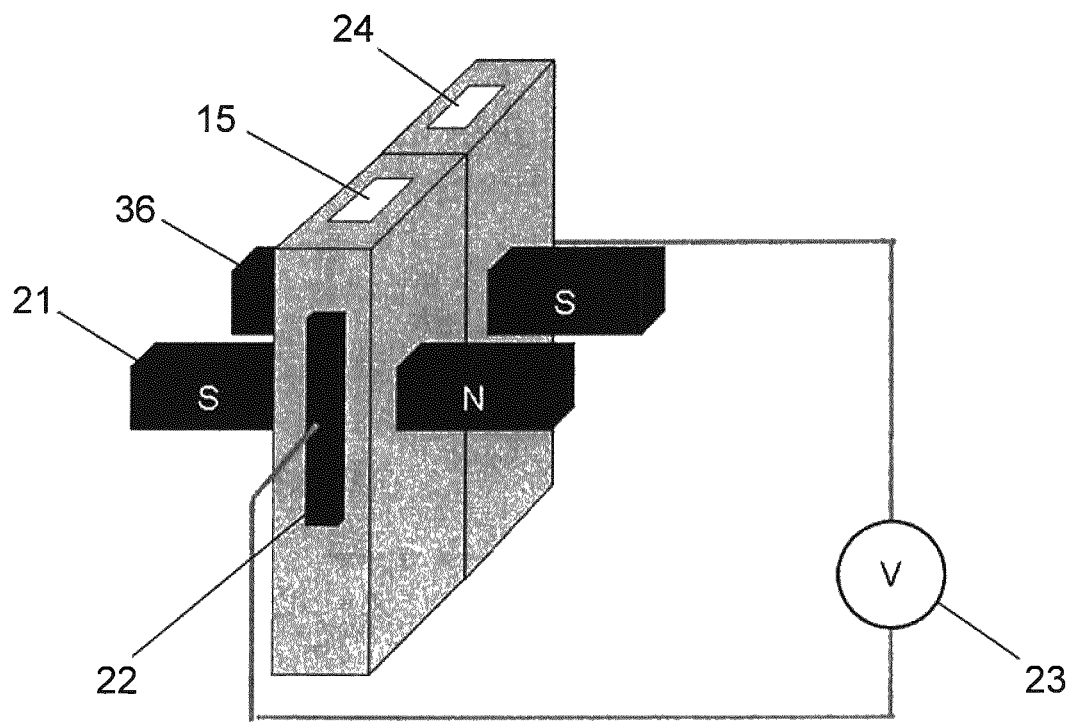

FIG. 2C shows a configuration wherein the electrodes 22 of feed tube 15 and feed tube 24 are connected in series which only requires one power supply 23 and wherein the same current passes through both feed tubes. In order to control the flow rate in each tube the magnetic field of the magnet 21, 36 in each tube 15, 24 is controlled separately.

FIG. 3A,3B shows schematically two configurations to control the strength of the magnetic field of permanent magnets by shorting the flux or by changing the distance of the magnetic poles to the electromagnetic pump. In the configuration according to FIG. 3A the flux between the poles of magnet 21 can be changed by shortening the magnetic flux via a second leg 38. The flux is variable by changing the distance between the poles of this second leg. To this end leg 38 of the yoke is designed to allow such linear displacement.

In the configuration according to FIG. 3B the magnetic strength is varied by varying the distance between the poles of magnet 21. This can be varied by a rotation or linear displacement. A rotational displacement is depicted in FIG. 3B where yoke 37 is provided with a pivoting point 39 and a spindle device 40 for a controlled rotation and therewith a controlled change of the distance between the poles of the magnet 21.

Figure 4:
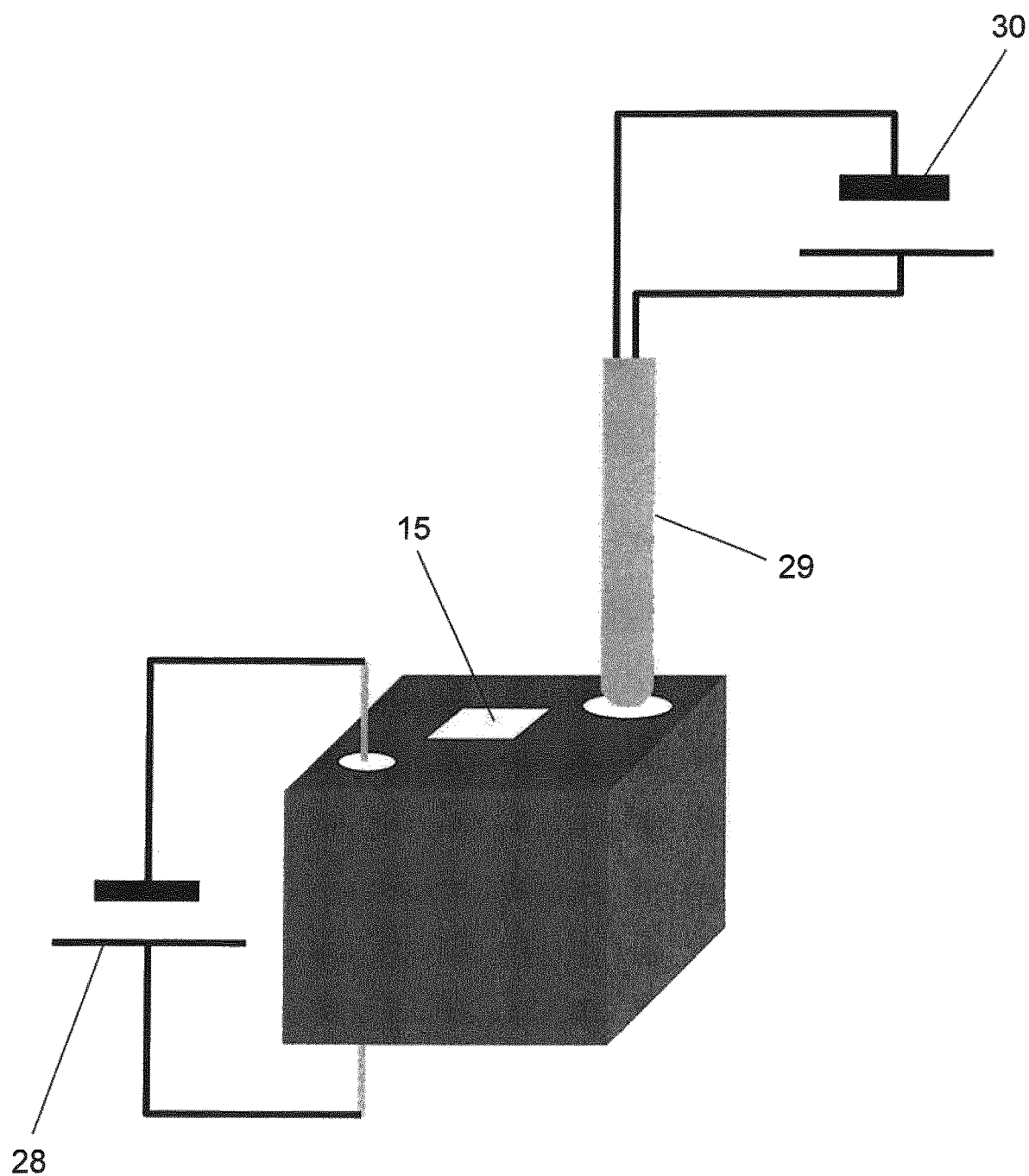
FIG. 4 shows schematically a detail of the feed tube with heating means.

FIG. 4 shows schematically a segment of a feed tube 15 with a channel 27 and two different heating embodiments. A first heating method is heating the feed tube by resistance heating with a power source 28 wherein the material of the feed tube serves as the resistance. The second heating method is with a sheath heater 29 with a power source 30, wherein the heater is provided in a hole or a recess in the feed tube 15. The power sources 28, 30 could be DC or AC power sources. This is in fact also resistance heating wherein the resistance is enclosed in a sheath and electrically isolated from the feed tube. All the tubing must be heated to a temperature above the melting point of the liquid metal for which a temperature of 40° C. above the melting temperature will in general be sufficient.

The invention claimed is:
1. An apparatus for feeding liquid metal to an evaporator device in a vacuum chamber, comprising
   the vacuum chamber and the evaporator device in the vacuum chamber;
   the apparatus further comprising
      a closed container adapted to contain a liquid metal, wherein a vessel to hold the liquid metal is located in the closed container,
      a feed tube extending from the vessel in the closed container to the evaporator device and an electromagnetic pump provided in the feed tube,
   a vacuum enclosure which encloses the electromagnetic pump, wherein the vacuum enclosure encloses at least part of the feed tube, wherein the vacuum enclosure is between the vacuum chamber and the closed container, and
   a first bellows and a second bellows;
   wherein the vacuum enclosure is outside of and spaced from the vacuum chamber,
   wherein the vacuum enclosure is outside of and spaced from the closed container,
   wherein the vacuum enclosure is connecting to the closed container via the first bellows in contact to an outside surface of the closed container and
   wherein the vacuum enclosure is connecting to the vacuum chamber via the second bellows in contact to an outside surface of the vacuum chamber;

wherein the feed tube extends through the vacuum enclosure and each of the bellows; and wherein the closed container defines a closed container internal space and the vacuum chamber defines a vacuum chamber internal space, wherein the connecting of the vacuum enclosure to the closed container by the first bellows and the connecting of the vacuum enclosure to the vacuum chamber by the second bellows does not connect the closed container internal space to the vacuum chamber internal space.

2. The apparatus according to claim 1, wherein the vacuum enclosure has a first vacuum pump for creating a first vacuum in the vacuum enclosure, the vacuum chamber has a second vacuum pump for creating a second vacuum in the vacuum chamber independent of the first vacuum, and the closed container has a gas supply for supplying non-oxidizing gas to the closed container.

3. The apparatus according to claim 2, further comprising lifting means within the closed container to lift and lower the vessel, and at least one weighing device which allows to weigh the content of the vessel.

4. The apparatus according to claim 3, wherein the electromagnetic pump is at least partially made of an electric conductive graphite, and wherein electrodes of the electromagnetic pump are provided against the electromagnetic pump.

5. The apparatus according to claim 4, wherein a return tube and an electromagnetic pump in the return tube is provided, wherein the return tube runs from the evaporator device to the container, wherein the electromagnetic pump in the feed tube and the electromagnetic pump in the return tube are positioned adjacent to each other and wherein a magnetic field for both electromagnetic pumps is supplied by the same magnet.

6. The apparatus according to claim 1, further comprising lifting means within the closed container to lift and lower the vessel, and at least one weighing device which allows to weigh the content of the vessel.

7. The apparatus according to claim 1, wherein the electromagnetic pump is at least partially made of an electric conductive material.

8. The apparatus according to claim 7, wherein the electromagnetic pump is at least partially made of graphite.

9. The apparatus according to claim 7, wherein the electromagnetic pump has a pump body and electrodes, and wherein the electrodes of the electromagnetic pump are provided against an outside of the electromagnetic pump or a recess in the pump body.

10. The apparatus according to claim 9,
wherein the feed tube passes through the electromagnetic pump, with the electrodes on opposite sides against the body of the electromagnetic pump, wherein the electrodes are connected to a power supply, wherein perpendicular to the electrodes are the poles of a magnet comprising two permanent magnets or an electromagnet.

11. The apparatus according to claim 1, further comprising a controller for varying current through the electromagnetic pump to control a Lorentz force exerted on the liquid metal in the container adapted to contain the liquid metal.

12. The apparatus according to claim 1, wherein the container adapted to contain the liquid metal is a closed container, and wherein the closed container is provided with a gas supply and valve to control the pressure of a gas in the closed container.

13. The apparatus according to claim 1, wherein the electromagnetic pump is configured to control a magnetic field generated by the electromagnetic pump.

14. The apparatus according to claim 13, wherein the magnetic field is provided by permanent magnets and the electromagnetic pump includes a yoke for varying a distance between magnetic poles with respect of the electromagnetic pump, and/or wherein the magnetic field is provided by a direct or alternating current electromagnet and the magnetic field is variable by controlling the current through a coil of the electromagnet.

15. The apparatus according to claim 1, wherein a magnet is provided outside the vacuum enclosure.

16. The apparatus according to claim 1, wherein the electromagnetic pump is provided with a permanent magnet arranged to generate a magnetic field for the electromagnetic pump.

17. The apparatus according to claim 1, wherein a valve is provided in the feed tube between the electromagnetic pump provided in the feed tube and the evaporator device for preventing the vacuum chamber from coming into contact with vacuum or pressure in the closed container after the feed tube has been drained.

18. The apparatus according to claim 1, further comprising a return tube extending from the evaporator device to the closed container and an electromagnetic pump provided in the return tube.

19. The apparatus according to claim 18, wherein the electromagnetic pump in the feed tube and the electromagnetic pump provided in the return tube are positioned adjacent to each other and wherein a magnetic field for both electromagnetic pumps is supplied by the same magnet.

20. The apparatus according to claim 18, wherein the electromagnetic pump provided in the feed tube and the electromagnetic pump provided in the return tube are positioned adjacent to each other and wherein current for both electromagnetic pumps is supplied by the same power supply.

21. An apparatus for feeding liquid metal to an evaporator device in a vacuum chamber, comprising
the vacuum chamber and the evaporator device in the vacuum chamber;
the apparatus further comprising
a closed container adapted to contain a liquid metal, wherein a vessel to hold the liquid metal is located in the closed container,
a feed tube extending from the vessel in the closed container to the evaporator device and an electromagnetic pump provided in the feed tube,
a vacuum enclosure which encloses the electromagnetic pump, wherein the vacuum enclosure encloses at least part of the feed tube, wherein the vacuum enclosure is between the vacuum chamber and the closed container, and
a first bellows and a second bellows;
wherein the vacuum enclosure is outside of and spaced from the vacuum chamber,
wherein the vacuum enclosure is outside of and spaced from the closed container,
wherein the vacuum enclosure is connecting to the closed container via the first bellows in contact to an outside surface of the closed container and
wherein the vacuum enclosure is connecting to the vacuum chamber via the second bellows in contact to an outside surface of the vacuum chamber;
wherein the feed tube extends through the vacuum enclosure and each of the bellows; and wherein the closed container defines a closed container internal space and the vacuum chamber defines a vacuum chamber internal space, wherein the connecting of the vacuum enclosure to the closed container by the first bellows and the connecting of the vacuum enclosure to the vacuum chamber by the second bellows does not connect the closed container internal space to the vacuum chamber internal space;

wherein the electromagnetic pump has a pump body and electrodes, and wherein the electrodes of the electromagnetic pump are provided against an outside of the electromagnetic pump or a recess in the pump body;

wherein the electromagnetic pump has a pump body and electrodes, and wherein the electrodes of the electromagnetic pump are provided against an outside of the electromagnetic pump or a recess in the pump body;

further comprising a return tube extending from the evaporator device to the closed container and a second electromagnetic pump provided in the return tube, wherein the feed tube and the return tube are next to each other with electromagnetic pumps for respectively the feed tube and return tube, wherein a magnetic field for both the feed tube and the return tube is provided with the same permanent magnets, wherein separate variable DC power supplies are provided for respectively the feed tube and the return tube which are reversely connected to the electrodes, wherein the feed tube and the return tube are in thermal contact with each other but electrically isolated from each other.

22. An apparatus for feeding liquid metal to an evaporator device in a vacuum chamber, comprising the vacuum chamber and the evaporator device in the vacuum chamber;

the apparatus further comprising
  a closed container adapted to contain a liquid metal, wherein a vessel to hold the liquid metal is located in the closed container,
  a feed tube extending from the vessel in the closed container to the evaporator device and an electromagnetic pump provided in the feed tube,
  a vacuum enclosure which encloses the electromagnetic pump, wherein the vacuum enclosure encloses at least part of the feed tube, wherein the vacuum enclosure is between the vacuum chamber and the closed container, and
  a first bellows and a second bellows;

wherein the vacuum enclosure is outside of and spaced from the vacuum chamber, wherein the vacuum enclosure is outside of and spaced from the closed container, wherein the vacuum enclosure is connecting to the closed container via the first bellows in contact to an outside surface of the closed container and wherein the vacuum enclosure is connecting to the vacuum chamber via the second bellows in contact to an outside surface of the vacuum chamber;

wherein the feed tube extends through the vacuum enclosure and each of the bellows; and wherein the closed container defines a closed container internal space and the vacuum chamber defines a vacuum chamber internal space, wherein the connecting of the vacuum enclosure to the closed container by the first bellows and the connecting of the vacuum enclosure to the vacuum chamber by the second bellows does not connect the closed container internal space to the vacuum chamber internal space;

wherein the electromagnetic pump has a pump body and electrodes, and wherein the electrodes of the electromagnetic pump are provided against an outside of the electromagnetic pump or a recess in the pump body;

wherein the electromagnetic pump has a pump body and electrodes, and wherein the electrodes of the electromagnetic pump are provided against an outside of the electromagnetic pump or a recess in the pump body;

further comprising a return tube extending from the evaporator device to the closed container and a second electromagnetic pump provided in the return tube, wherein the feed tube and the return tube are next to each other with electromagnetic pumps for respectively the feed tube and return tube, wherein a magnetic field for the feed tube is provided with first permanent magnets, wherein a magnetic field for the return tube is provided with second permanent magnets, wherein the electrodes of feed tube and return tube are connected in series to one power supply to pass the same current through both feed tube and return tube and to separately control a magnetic field of the first and second permanent magnets to control the flow rate in feed tube and return tube.

* * * * *